United States Patent [19]
Yoshizaki

[11] Patent Number: 5,475,236
[45] Date of Patent: Dec. 12, 1995

[54] SEMICONDUCTOR CHIP FOR MOUNTING ON A SEMICONDUCTOR PACKAGE SUBSTRATE BY A FLIP-CLIP PROCESS

[75] Inventor: Thutomu Yoshizaki, Kawasaki, Japan

[73] Assignee: Fujitsu Limited, Kawasaki, Japan

[21] Appl. No.: 407,052

[22] Filed: Mar. 17, 1995

Related U.S. Application Data

[63] Continuation of Ser. No. 939,698, Sep. 2, 1992, abandoned.

[30] Foreign Application Priority Data

Sep. 2, 1991 [JP] Japan ..................... 3-221822

[51] Int. Cl.⁶ .................. H01L 29/41; H01L 23/544; H01L 21/66
[52] U.S. Cl. .............. 257/48; 257/690; 257/778; 257/786
[58] Field of Search ................ 257/48, 778, 786, 257/780, 777, 690–693, 737, 738, 741, 765, 773; 324/765, 757

[56] References Cited

U.S. PATENT DOCUMENTS

| | | | |
|---|---|---|---|
| 4,774,630 | 9/1988 | Reisman et al. | 257/778 |
| 5,212,406 | 5/1993 | Reele et al. | 257/778 |

FOREIGN PATENT DOCUMENTS

| | | | |
|---|---|---|---|
| 0062341 | 3/1988 | Japan | 257/786 |
| 0128636 | 6/1988 | Japan | 257/48 |
| 0082129 | 4/1991 | Japan | 257/48 |

OTHER PUBLICATIONS

IBM Technical Disclosure Bulletin, vol. 27, No. 7B, Dec. 1984, New York US, pp. 4210–4211, Anderson et al. 'Extended Pad for Testing Package Parts' *whole document*.

Patent Abstracts of Japan, vol. 15, No. 254 (E–1083)8 Apr. 1991 & JP–A–30 82 129 (Agency of Ind Science & Technol) *abstract*.

Patent Abstracts of Japan, vol. 12, No. 285 (E–642)4 Aug. 1988 & JP–A–63 062 341 (Fujitsu Ltd) 18 Mar. 1988 *abstract*.

Patent Abstracts of Japan, vol. 9, No. 4 (E–288)10 Jan. 1985 & JP–A–59 154 035 (Nippon Denso KK) 3 Sep. 1984 *abstract*.

*Primary Examiner*—William Mintel
*Assistant Examiner*—Peter Toby Brown
*Attorney, Agent, or Firm*—Staas & Halsey

[57] ABSTRACT

A semiconductor chip for mounting on a package substrate by a flip-chip process includes a plurality of electrode pads of a first group provided on a major surface of the semiconductor chip for external electrical connection such that the electrode pads of the first group cover a major surface of the semiconductor chip in rows and columns; and a plurality of electrode pads of a second group each having a size substantially larger than the electrode pads of the first group and provided on the major surface of the semiconductor chip in electrical connection with an active part of the semiconductor chip that is used for a burn-in process. Each of the electrode pads of the first group is covered by a solder bump that projects from the major surface of the semiconductor chip a first distance. Each of the electrode pads of the second group is formed of a conductor material having a melting point higher than the solder bump and projecting from the major surface of the semiconductor chip a second distance that is substantially smaller than the first distance.

4 Claims, 5 Drawing Sheets

SEMICONDUCTOR CHIP FOR MOUNTING ON A SEMICONDUCTOR PACKAGE SUBSTRATE BY A FLIP-CLIP PROCESS

This application is a continuation of application Ser. No. 07/939,698, filed Sep. 2, 1992, now abandoned.

BACKGROUND OF THE INVENTION

The present invention generally relates to semiconductor devices, and more particularly to a semiconductor package that includes a semiconductor chip formed with solder bumps for mounting the chip on a package substrate with a flip-chip process.

With the increase in the integration density of semiconductor integrated circuits, the number of electrode pads on a semiconductor chip is increasing, and such an increase in the electrode pads inevitably results in a corresponding decrease in the mutual distance therebetween. In such very large scale integrated circuits, therefore, the conventional package structure of the SIP type or DIP type is not suitable, as the tip ends of inner leads tend to contact with each other because of the reduced mutual separation between the electrode pads. A similar problem occurs also in multiple chip modules wherein a number of integrated circuit chips are mounted on a common package substrate.

In order to achieve a successful electric connection to such high performance integrated circuits, a flip-chip process is proposed wherein the electrode pads are formed on the entirety of the lower major surface of the semiconductor chip in a row and column formation and wherein the semiconductor chip is placed on the upper major surface of a package substrate such that the electrode pads establish an electric connection with corresponding electrodes provided on the upper major surface of the package substrate. The electric connection between the electrode pad and corresponding electrode is achieved by providing a solder bump in correspondence to each of the electrode pads and causing a reflow of the solder by passing the semiconductor chip through a heating furnace together with the package substrate. According to the flip-chip process, one can increase the number of electrode pads formed on the semiconductor chip significantly, without causing a contact with each other.

However, when the number of the electrode pads is excessive, there still occurs the problem of unwanted contact of adjacent electrode pads even when the flip-chip process is used. In the flip-chip process, the chance that adjacent solder bumps may contact each other as a result of the reflowing of the solder increases with the increasing number of electrode pads and hence with decreasing distance between the solder bumps. Thus, there is a need for an improvement of the flip-chip process in order to apply the flip-chip process to semiconductor devices where a large number of electrode pads are formed on the chip surface with a reduced separation.

Meanwhile, the semiconductor chips are generally subjected to a so-called "burn-in" process before the device is shipped to the user in order to ensure the proper operation of the device. In the burn-in process, a predetermined voltage is applied to predetermined electrode pads on the chip to simulate a severe operational condition that the chip may encounter during the use of the device. After the burn-in process, those chips that showed a failure are discarded. In such a burn-in process, it is necessary to provide an electrical contact to the minute electrode pads. Such an electrical contact is difficult to achieve in the devices where the separation between the electrode pads is very small. Generally, such an electrical contact is achieved by a sharp-pointed probe needle. The contact by the probe needle tends to cause a damage to the solder bump that is provided on the electrode pad. Once the solder bump is damaged, there is a substantial risk that the electrical connection between the chip and the package substrate will become defective.

FIG. 1 shows a conventional semiconductor chip 1 designed for the flip-chip process. There, the chip 1 includes a chip body 2 defined by a bottom surface 2a, and a number of electrode pads are formed substantially on the entirety of the surface 2a in a row and column formation. Thereby, a very large number of electrode pads can be formed on a single chip body 2. It should be noted that each electrode pad is provided with a corresponding solder bump 3 for external electrical connection.

FIG. 2 shows the structure of a semiconductor package 4 that accommodates therein the chip 1 of FIG. 1. There, the semiconductor package 4 includes a package substrate 7 of a ceramic material, and the package substrate 7 carries an interconnection pattern 10 on the upper major surface thereof. The semiconductor chip 1 is mounted on the upper major surface of the substrate 7 by a flip-chip process such that each solder bump 3 on the surface 2a establishes a contact with the interconnection pattern 10. Then, the substrate 7 and the chip 1 are passed through a furnace to cause a reflowing of the solder bump 3 as shown in FIG. 3.

In FIG. 3, it will be noted that the distance between the lower major surface 2a of the chip 2 and the upper major surface 10a of the interconnection pattern 10, designated in FIG. 3 as "T," is an essential factor for proper electrical connection between the electrode pad on the chip 1 and the interconnection pattern 10. When the distance T is excessively large, the contact between the solder bump and the interconnection pattern may not occur. On the other hand, when the distance T is excessively small, the molten solder bump 3 may spread laterally and cause an unwanted short circuit.

Referring to FIG. 2 again, the substrate 7 has a lower major surface 7a wherein a number of electrode pads are formed in electrical connection with the interconnection pattern 10, and the electrode pads at the surface 7a are covered by corresponding solder bumps 11. Further, the semiconductor chip 1 is covered by a cap or enclosure 6 that is bonded to the substrate 7 by solder 8 such that the cap 6 forms a closed space together with the substrate 7 for accommodating therein the semiconductor chip 1. It should be noted that the chip 1 is bonded to the cap 6 at the upper major surface of the chip body 2 by solder 5. Thereby, the chip 1 is hermetically sealed within the package 4.

In such a conventional package structure, the solder bumps 3 may contact with each other upon reflowing when the distance T of FIG. 3 is insufficient. Thus, although the structure of FIG. 2 may be advantageous for increasing the number of electrode pads, there exists a limitation in the number of the electrode pads that can be formed on the surface 2a of the chip 1. In the devices where there are a large number of solder bumps separated from each other by a minute distance, the proper setting of the distance T becomes an essential factor for increasing the yield of the device.

FIGS. 4(A) and 4(B) show the conventional process of burn-in as applied to the semiconductor chip 1 of FIG. 1.

Referring to FIGS. 4(A) and 4(B), the semiconductor chip 1 is mounted on a jig 13 that has one or more probe needles 12 in correspondence to the solder bumps 3 that cover the electrode pads to which a burn-in voltage is to be applied.

As shown in FIG. 4(A), the jig 13 has a stepped side wall part 13a for holding a side wall 2b of the chip 1 firmly. Alternatively, the chip 1 may be fixed against the jig 13 by a solder bump 3a that fits into a depression 13b formed on the side wall part of the jig 13 for fixing the chip 1 to the jig 13 upon reflowing as shown in FIG. 4(B).

In any of these conventional burn-in processes, the probe needles 12 are urged resiliently against the solder bumps 3 by the action of a spring, and a predetermined voltage is applied for causing the burn-in. Thereby, the sharp-pointed end of the probe needle 12 may penetrate into the solder bump 3 and cause damage thereto. When such a semiconductor chip having damage in the solder bump 3 is used in the flip-chip process to form the package structure of FIG. 2, the wetting of the solder upon reflowing may be degraded and the risk of defective electric connection increases. Further, the burn-in process as shown in FIGS. 4(A) and 4(B) cannot be applied to the devices wherein a very large number of electrode pads are formed on the surface of the chip body with a minute mutual separation because of the mechanical limitation in the reduction of mutual separation between the probe needles.

SUMMARY OF THE INVENTION

Accordingly, it is a general object of the present invention to provide a novel and useful semiconductor device, wherein the foregoing problems are eliminated.

Another and more specific object of the present invention is to provide a semiconductor chip for mounting on a package substrate by a flip-chip process, wherein the mutual separation between adjacent electrode pads on a semiconductor chip is reduced while eliminating the contact between solder bumps that cover the electrode pads.

Another object of the present invention is to provide a semiconductor chip for mounting on a package substrate by a flip-chip process, wherein the device has a structure for implementing a burn-in process without causing damage to solder bumps that are formed on a surface of a semiconductor chip.

Another object of the present invention is to provide a semiconductor chip for mounting on a package substrate by a flip-chip process, comprising: a plurality of electrode pads of a first group provided on a major surface of said semiconductor chip for external electrical connection, each of said electrode pads of said first group having a first lateral size and connected electrically to an active part of said semiconductor chip, said electrode pads of said first group being provided in rows and columns on said major surface of said semiconductor chip; and a plurality of electrode pads of a second group each having a second lateral size substantially larger than said first lateral size and provided on said major surface of said semiconductor chip in electrical connection with an active part of said semiconductor chip that is used for a burn-in process; each of said electrode pads of said first group being covered by a solder bump that projects from said major surface of said semiconductor chip a first distance; each of said electrode pads of said second group being formed of a conductor material having a melting point higher than said solder bump and projecting from said major surface of said semiconductor chip a second distance that is substantially smaller than said first distance.

According to the present invention, one can eliminate the problem of short circuit caused by the lateral spreading of the solder bumps upon mounting of the semiconductor chip on a package substrate by a flip chip process, by means of the electrode pad of the second group that acts as a stopper for preventing excessive decrease of distance between the semiconductor chip and the package substrate. Further, by providing the electrode pads of the second group in electrical connection with active regions provided inside the semiconductor chip for a burn-in process, one can avoid the damaging to the solder bumps upon implementation of the burn-in process, as the electrode pads of the second group alone are used for the burn-in process. The solder bumps corresponding to the electrode pads of the first group remain intact. Thus, the semiconductor chip of the present invention is effective for eliminating any failure of the semiconductor device that occurs after the burn-in process is conducted. As the electrode pad of the second group has the second lateral size substantially larger than the first lateral size, the burn-in process is achieved easily and efficiently.

Other objects and further features of the present invention will become apparent from the following detailed description when read in conjunction with the attached drawings.

DETAILED DESCRIPTION OF THE PREFERRED EMBODIMENTS

Figure 1:
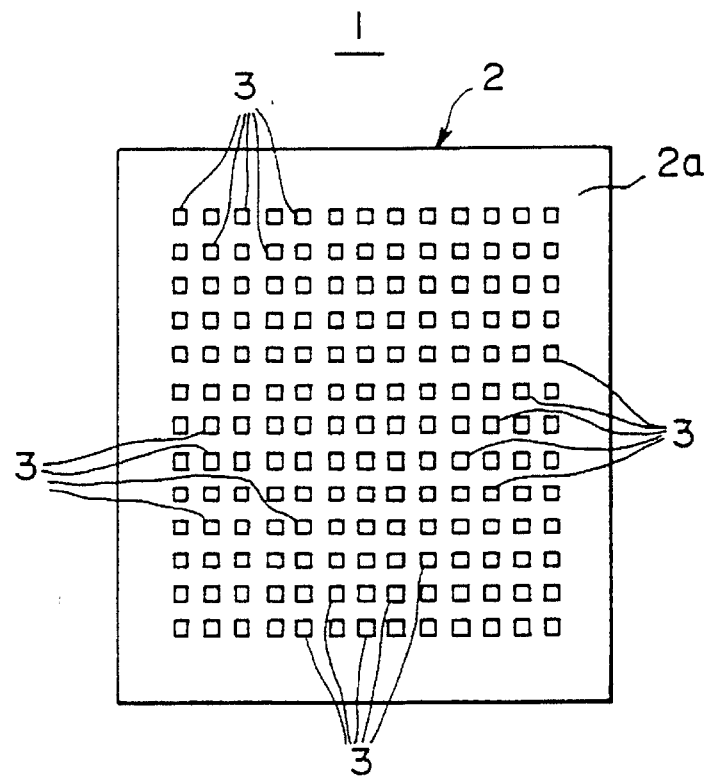
FIG. 1 is a diagram showing a conventional semiconductor chip for mounting on a package according to a flip-chip process, in a bottom view.
Figure 2:
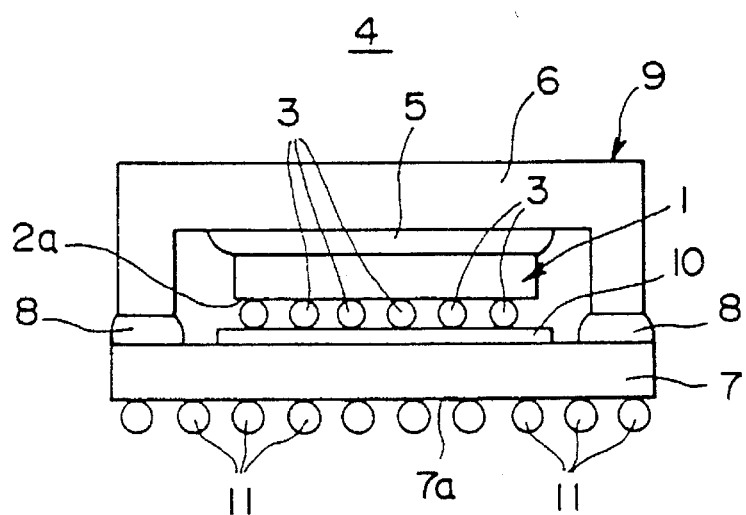
FIG. 2 is a diagram showing the structure of a semiconductor package in which the semiconductor chip of FIG. 1 is mounted by the flip-chip process.
Figure 3:
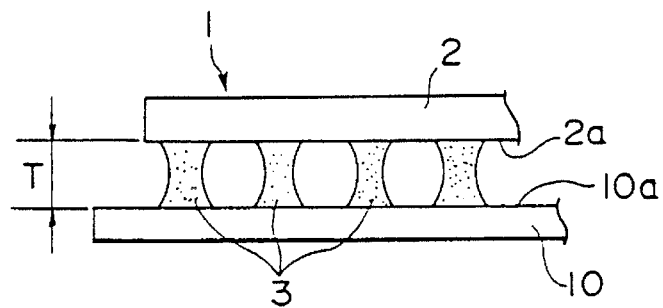
FIG. 3 is a diagram showing the details of reflowing of the solder bump occurring in the device of FIG. 2, together with a parameter that is critical for the successful flip-chip process.
Figure 4A:
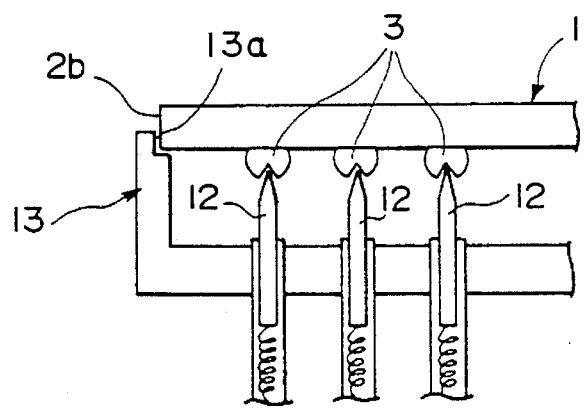
FIG. 4(A) and 4(B) are diagrams showing a burn-in process applied conventionally for the semiconductor chip of FIG. 1.
Figure 4B:
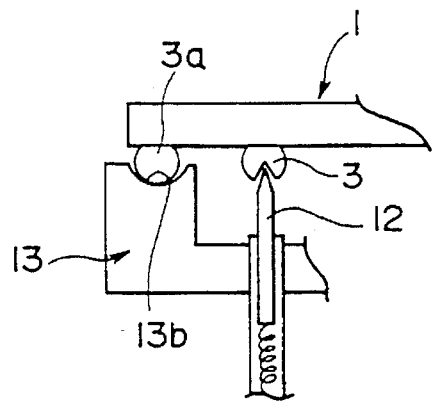
Figure 5:
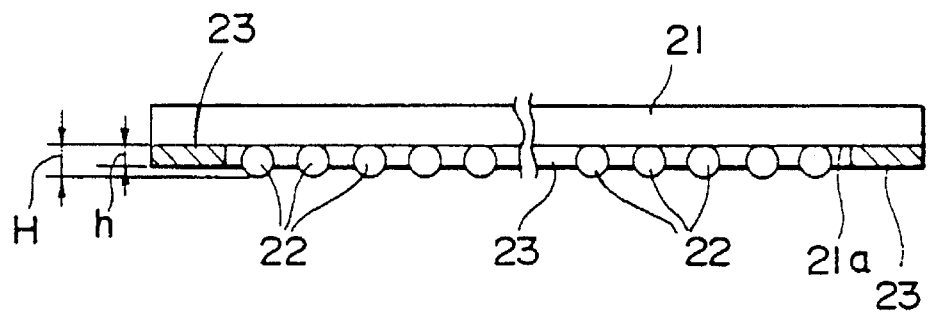
FIG. 5 is a diagram showing a semiconductor chip according to a first embodiment of the present invention in an elevational cross sectional view.
Figure 6:
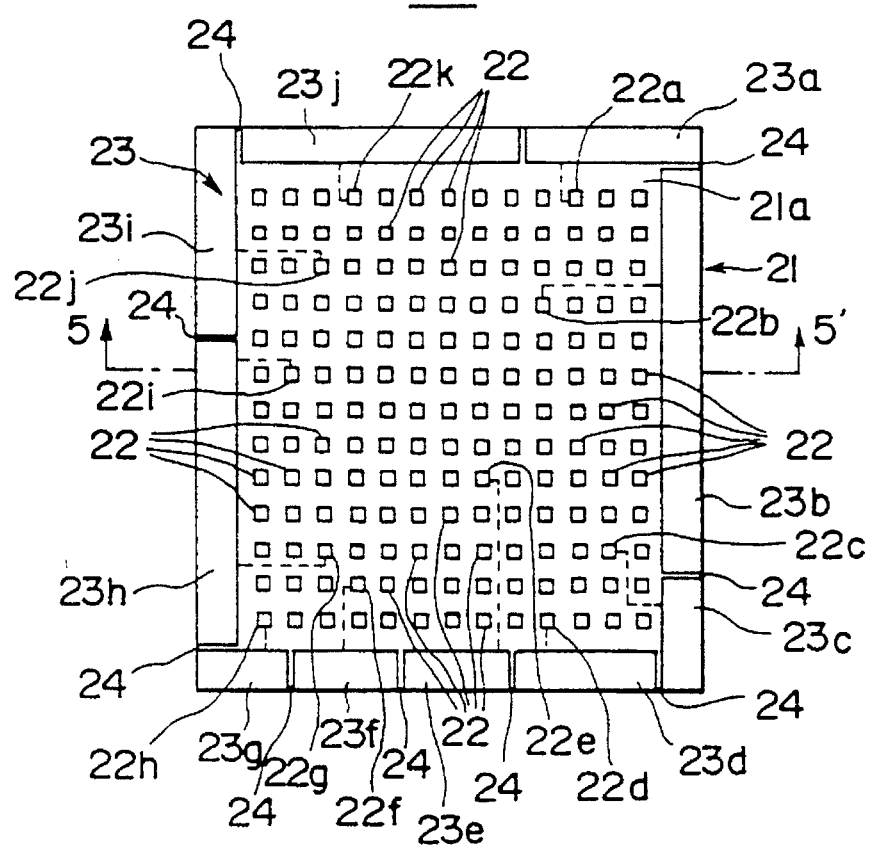
FIG. 6 is a diagram showing the semiconductor chip of FIG. 5 in a bottom view.

FIG. 5 shows a semiconductor chip 20 according to a first embodiment of the present invention in an elevational cross sectional view, while FIG. 6 shows the same semiconductor chip 20 in a bottom view. There, FIG. 5 shows the cross section taken along a line 5–5' of FIG. 6.

Referring to FIG. 5, the semiconductor chip 20 includes a chip body 21 having a lower major surface 21a, and there are provided a number of electrode pads 22 on the surface 21a of the chip body 21 in a row and column formation, as shown in FIG. 6. Typically, each electrode pad 22 is disposed with a pitch or mutual distance of 50 μm. Further, each electrode pad 22 is covered by a solder bump and there is formed an array of solder bumps at the bottom surface of the chip body 21 in correspondence to the electrode pad as shown in FIG. 6. Because of this reason, the electrode pad and the solder bump are designated by the same reference numeral 22. As usual, each electrode pad 22 is connected to an active part formed in the semiconductor chip such as a diffusion region by an interconnection pattern embedded in the chip body 21.

Further, the chip body 21 is provided with a plurality of electrode pads 23a–23j generally designated as 23, wherein the electrode pads 23a–23i have a size substantially larger than the electrode pads 22 as shown in FIG. 6. In the illustrated example, each electrode pad 23 has an elongated rectangular form and is disposed along the lateral edge of the chip body 21 such that the longitudinal direction of pad 23 coincides with the direction of a lateral edge of the chip body 21. Each electrode pad 23 may have an elongate rectangular shape with the shorter edge thereof having a length of 240 µm.

Each electrode pad 23 is isolated from adjacent electrode pad by a gap 24 and is connected to an active part such as a diffusion region formed in the semiconductor chip 20 via an interconnection structure schematically designated in FIG. 6 by a broken line. More specifically, there exist predetermined electrode pads 22a–22k that are connected to an internal diagnosis circuit, and each of these electrode pads 22a–22j is connected to a corresponding electrode pad 23a–23j by an interconnection structure embedded within the semiconductor chip 20. The electrode pad 23 is used for applying a burn-in against the chip and for testing the function of the chip after the burn-in. However, the use of the electrode pad 23 is not limited to the burn-in process but may be used for supplying electric power and the like.

Figure 7:
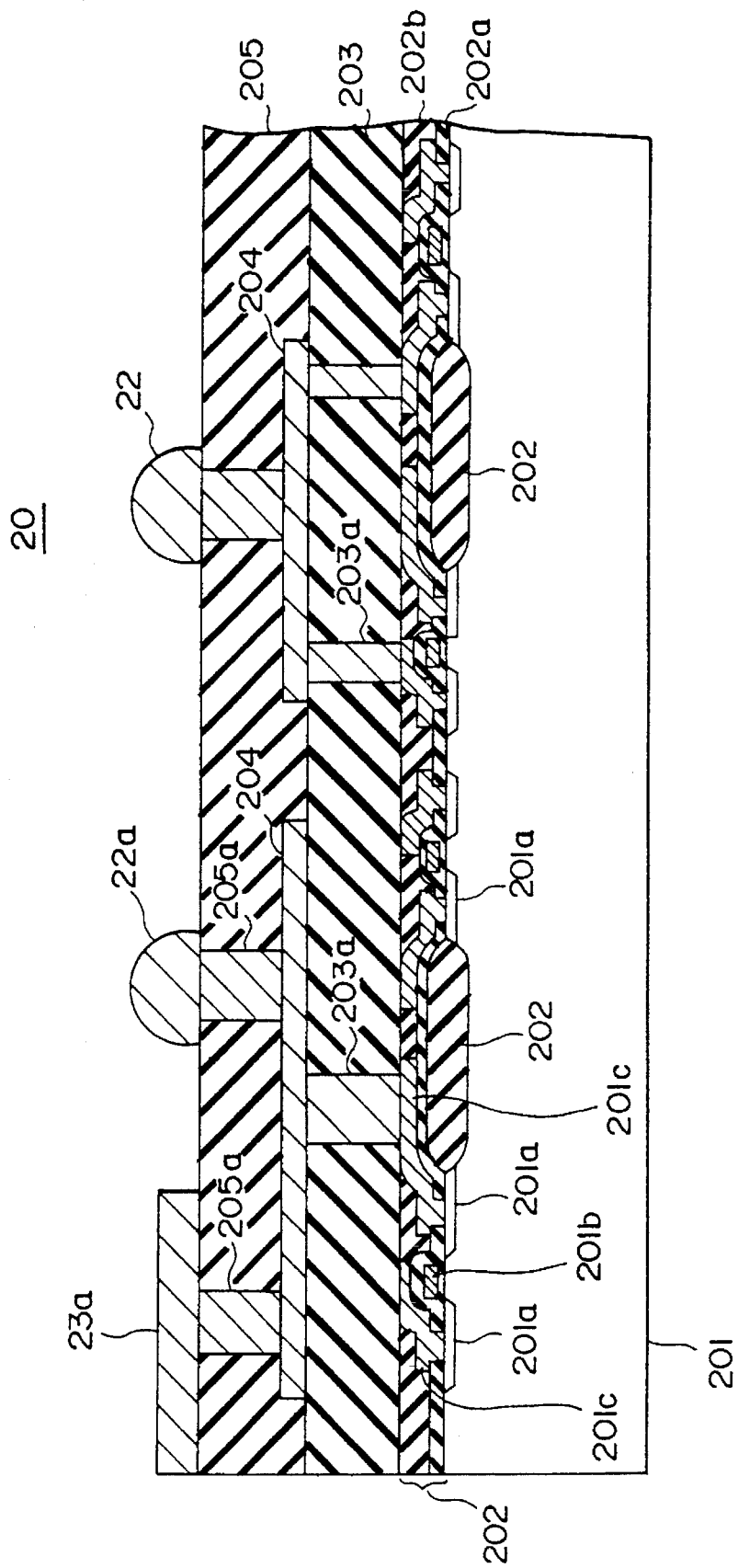
FIG. 7 is a diagram showing an essential part of the semiconductor chip of FIG. 5 in an enlarged cross sectional view.

FIG. 7 shows a cross sectional view of the semiconductor chip 20.

Referring to FIG. 7, the semiconductor chip 20 includes a semiconductor substrate 201 that is formed with field oxide regions 200 for defining the active region of the device. In correspondence to the active region, there are formed diffusion regions 201a, and the diffusion regions 201a are buried under an insulation structure 202 together with any active structures such as a gate electrode 201b that is formed on the upper major surface of the substrate 201. There, the insulation structure 202 includes an insulation layer 202a covering the surface of the semiconductor substrate 201 and a planarization layer 202b that covers the layer 202a. Further, an interconnection electrode 201c is provided in electrical connection with the diffusion region 201a via a contact hole that is formed in the layer 202a. In the structure of FIG. 7, the electrode 201c is exposed at the upper major surface of the layer 202b.

The insulation structure 202 is further covered by an insulation layer 203 that is formed with a contact hole 203a. The contact hole 203a is formed in correspondence to the exposed part of the electrode 201c and is filled with an electrode pattern 204 formed on the upper major surface of the layer 203. Thereby, the electrode pattern 204 establishes an electrical connection with the diffusion region 201a via the electrode 201c.

The electrode pattern 204 is buried under another insulation layer 205, and the insulation layer 205 is formed with contact holes 205a in correspondence to the electrode pattern 204 such that the contact hole 205a exposes the electrode pattern 204. Further, the each contact hole 205a is filled by a conductor, and the solder bump 22 and the electrode pad 23 are provided on the insulation layer 205 in correspondence to the contact holes 205a. In the structure of FIG. 7, it should be noted that the solder bump 22a and the electrode pad 23a are both connected to the diffusion region 201a in the substrate 201. As will be described later, the active part that includes the diffusion region 201a to which the electrode pad 23 is connected, is used for the burn-in process.

Referring to FIG. 5 again, the electrode pad 23 is formed typically of gold or aluminum that has a melting point substantially higher than the solder alloy forming the solder bump 22. Thus, even when the solder bump 22 causes a reflow upon passage through a furnace, the electrode pad 23 does not cause reflowing. Further, the electrode pad 23 is formed to have a thickness h such that the thickness h is smaller than a projection H of the solder bump 22 (h<H). Typically, the projection H of the solder bump 22 is about 100 µm, while the thickness h of the electrode pad 23 is set to 1–3 µm. Thereby, the solder bump 22 projects beyond the electrode pad 23 by about 97–93 µm. By setting the thickness h of the electrode pad 23 with respect to the projection of the solder bump 22 as such, one can guarantee the contact between the solder bump 22 and an interconnection pattern when the semiconductor chip 1 is placed on a package substrate by the flip-chip process. Thereby, the solder bump 22 develops a firm and reliable electrical contact against the interconnection pattern that is provided on the package substrate upon reflowing.

Figure 8:
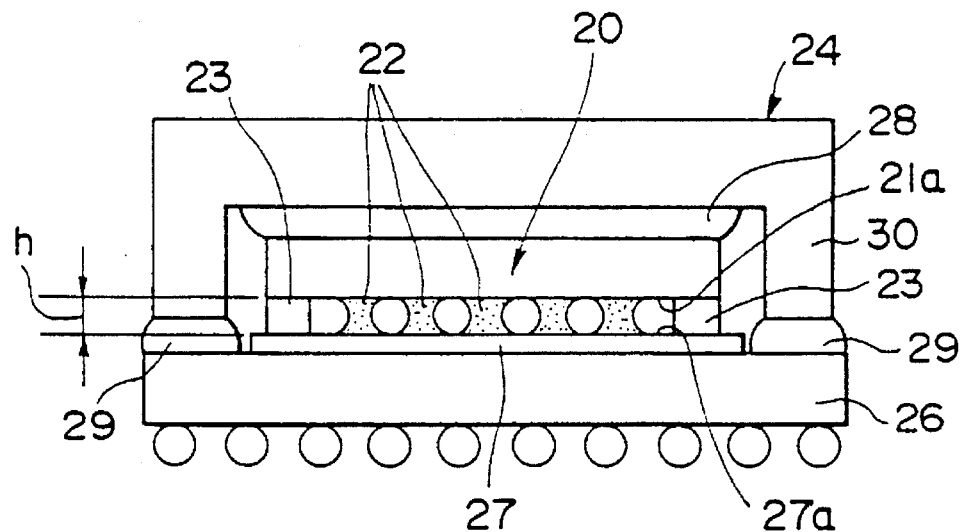
FIG. 8 is a diagram showing the structure of a semiconductor device that uses the semiconductor chip of FIG. 5.

FIG. 8 shows the structure of a semiconductor package 25 that uses the semiconductor chip 20 of FIG. 5.

Referring to FIG. 8, the semiconductor chip 20 is supported on a package substrate 26 of a ceramic material via an interconnection substrate 27 that covers the upper major surface of the package substrate 26 and carries thereon a conductor pattern 27a. Further, the substrate 26 has a lower major surface 26a on which a number of solder bumps are formed, and the solder bumps are connected to the conductor pattern 27a via a through-hole (not shown) formed in the substrate 26.

The semiconductor chip 20 is mounted on the interconnection substrate by a flip-chip process such that each solder bump 22 on the surface 21a of the semiconductor chip 20 establishes a firm and reliable contact with a corresponding part of the conductor pattern 27a formed on the interconnection substrate 27. Such a contact is achieved by passing the chip 20 together with the substrate 26 thus supporting the chip thereon through a furnace for causing a reflowing of the solder bump 22. Further, a cap 30 is mounted on the upper major surface of the package substrate 26 by solder 29 to form a closed package body 24. The semiconductor chip 20 is mounted on the inner surface of the cap 30 by solder 28 and hermetically sealed in the package body 24 as usual. The soldering of the cap 30 on the package substrate 26 may be achieved simultaneously with the flip-chip process for mounting the semiconductor chip on the interconnection substrate 27 or may be achieved separately.

When mounting the semiconductor chip 20 on the interconnection substrate 27, the contact between the solder bump 22 and the interconnection pattern 27a is achieved without problem when the electrode pads 23 are provided along the edge of the semiconductor chip 20, as the thicknesses h of the electrode pad 23 are set smaller than the projection H of the solder bumps 22. On the other hand, the problem of excessive approach of the semiconductor chip 20 to the interconnection substrate 27, which tends to cause the lateral spreading of the solder bump 22 upon reflowing, is positively eliminated, because the electrode pad 23 does not melt at the temperature employed for the reflowing.

Thereby, the semiconductor chip 20 according to the present invention is effective for eliminating any short circuit that tends to occur upon reflowing of the solder bump.

Figure 9:
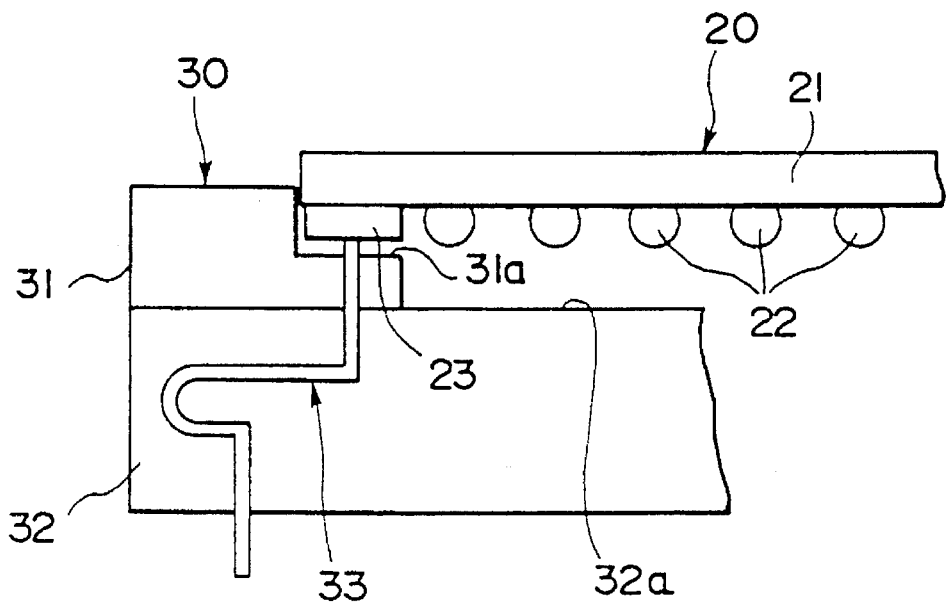
FIG. 9 is a diagram showing the burn-in process as applied to the semiconductor chip of FIG. 5.

FIG. 9 shows the burn-in process as applied to the semiconductor chip 20 of FIG. 5.

Referring to FIG. 9, the burn-in process uses a jig 30 that includes a base 32 and a holder member 31 provided on an upper major surface 32a of the base 32. There, the holder member 31 is formed with a shoulder part 31a, and a probe needle 33 is provided to project from the shoulder part 31a in an upward direction.

The semiconductor chip 20 is placed on the jig 30 such that the electrode pad 23 engages with the shoulder part 31a as illustrated in FIG. 9, and the probe needle 33 establishes thereby an electrical contact with the lower surface of the electrode pad 23. As the upper major surface 32a of the base 32 is located at a level much lower than the shoulder part 31a, there is no risk that the solder bumps at the lower major surface of the semiconductor chip 20 are damaged by making contact with the surface 32a.

In the state shown in FIG. 9, the burn-in voltage is applied to the electrode pad 23 via the probe needle 33 for simulating a severe operational environment. Thereby, it should be noted that the solder bumps 22 at the lower major surface of the semiconductor chip 20 remain intact, and the risk that a failure develops in the electrical connection between solder bump 22 and the interconnection pattern 27a on the interconnection substrate is substantially reduced. As the electrode pads 23 have a size much larger than the electrode pads 22, there is no difficulty in contacting the probe needle 33 to the intended electrode pad 23. Thus, the structure proposed in the present invention is particularly suitable for a semiconductor device having a very large integration density and hence a very large number of electrode pads.

Further, the present invention is not limited to the embodiments described heretofore, but various variations and modifications may be made without departing from the scope of the invention.

What is claimed is:

1. A semiconductor chip for mounting on a package substrate by a flip-chip process, comprising:

a plurality of electrode pads of a first group provided on a major surface of said semiconductor chip for external electrical connection, each of said electrode pads of said first group having a first size and connected electrically to an active part of said semiconductor chip, said electrode pads of said first group being provided in rows and columns on said major surface of said semiconductor chip; and a plurality of electrode pads of a second group each having a second size substantially larger than said first size and provided on said major surface of said semiconductor chip in electrical connection with an active part of said semiconductor chip that is used for a burn-in process;

each of said electrode pads of said first group being covered by a solder bump that projects from said major surface of said semiconductor chip a first distance;

each of said electrode pads of said second group being formed of a conductor material having a melting point higher than said solder bump and projecting from said major surface of said semiconductor chip a second distance that is substantially smaller than said first distance;

each of said electrode pads of said second group being connected electrically to a corresponding electrode pad of said first group; and each of said solder bumps having a center at a level closer than a level of said electrode pads of said second group, to said major surface of said semiconductor chip.

2. A semiconductor chip as claimed in claim 1 in which said electrode pads of said second group are formed of a metal selected from a group consisting of Al and Au.

3. A semiconductor chip as claimed in claim 1 in which said second distance is set with respect to said first distance such that said solder bumps do not contact each other when the semiconductor chip is mounted on a package substrate by a flip-chip process wherein said major surface of said semiconductor chip is connected to a major surface of said package substrate.

4. A semiconductor chip as claimed in claim 1 in which said electrode pads of said second group are disposed along an edge of said semiconductor chip.

\* \* \* \* \*

UNITED STATES PATENT AND TRADEMARK OFFICE
CERTIFICATE OF CORRECTION

PATENT NO. : 5,475,236
DATED : December 12, 1995
INVENTOR(S) : Thutomu YOSHIZAKI It is certified that error appears in the above-indentified patent and that said Letters Patent is hereby corrected as shown below:

<u>Column 5</u>

Line 24, "22a-22k" should be --22a-22j--.
Line 64, "the" should be deleted.

Signed and Sealed this

Twelfth Day of March, 1996

BRUCE LEHMAN

Attest:

Attesting Officer          Commissioner of Patents and Trademarks